(12) United States Patent
Sugimoto et al.

(10) Patent No.: US 9,018,835 B2
(45) Date of Patent: Apr. 28, 2015

(54) ORGANIC EL DEVICE, ELECTRONIC DEVICE, AND PROCESS FOR PRODUCTION OF ORGANIC EL DEVICE

(75) Inventors: Hiroshi Sugimoto, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 243 days.

(21) Appl. No.: 13/696,285

(22) PCT Filed: Jan. 26, 2011

(86) PCT No.: PCT/JP2011/051492
§ 371 (c)(1),
(2), (4) Date: Nov. 5, 2012

(87) PCT Pub. No.: WO2011/152079
PCT Pub. Date: Dec. 8, 2011

(65) Prior Publication Data
US 2013/0057143 A1    Mar. 7, 2013

(30) Foreign Application Priority Data
May 31, 2010  (JP) .................................. 2010-124627

(51) Int. Cl.
  *H01L 51/50*   (2006.01)
  *H01L 51/52*   (2006.01)
  *H01L 27/32*   (2006.01)

(52) U.S. Cl.
  CPC ........... *H01L 51/5228* (2013.01); *H01L 51/525* (2013.01); *H01L 27/3246* (2013.01)

(58) Field of Classification Search
  CPC . H01L 51/52; H01L 51/5044; H01L 51/5228; H01L 51/525

USPC ............................. 313/504, 506, 512; 445/24
See application file for complete search history.

(56) References Cited

U.S. PATENT DOCUMENTS

| | | | |
|---|---|---|---|
| 2007/0057627 A1 | 3/2007 | Kidu et al. | |
| 2008/0284323 A1* | 11/2008 | Kashiwabara et al. | 313/504 |
| 2009/0009069 A1* | 1/2009 | Takata | 313/504 |
| 2010/0309101 A1 | 12/2010 | Kanegae et al. | |

FOREIGN PATENT DOCUMENTS

| | | |
|---|---|---|
| JP | 2001-6881 A | 1/2001 |
| JP | 2006-185789 A | 7/2006 |
| JP | 2007-109829 A | 4/2007 |
| WO | 2009/133680 A1 | 11/2009 |

OTHER PUBLICATIONS

International Search Report received for PCT Patent Application No. PCT/JP2011/051492; mailed on Apr. 19, 2011, 4 pages (1 page of English translation and 3 pages of PCT Search Report).

* cited by examiner

*Primary Examiner* — Karabi Guharay
(74) *Attorney, Agent, or Firm* — Morrison & Foerster LLP

(57) ABSTRACT

An organic EL device (1) includes: a substrate (11); a plurality of lower electrodes (14) formed on the substrate (11) and corresponding to luminescence regions, respectively; a dividing wall (17) formed so as to surround the luminescence regions; light-emitting layers (19) formed on the lower electrodes (14) in the luminescence regions, respectively; and an upper electrode (20) formed on the dividing wall (17) and the light-emitting layers (19). The dividing wall (17) is conductive and electrically connected to the upper electrode (20).

9 Claims, 7 Drawing Sheets

F I G. 3
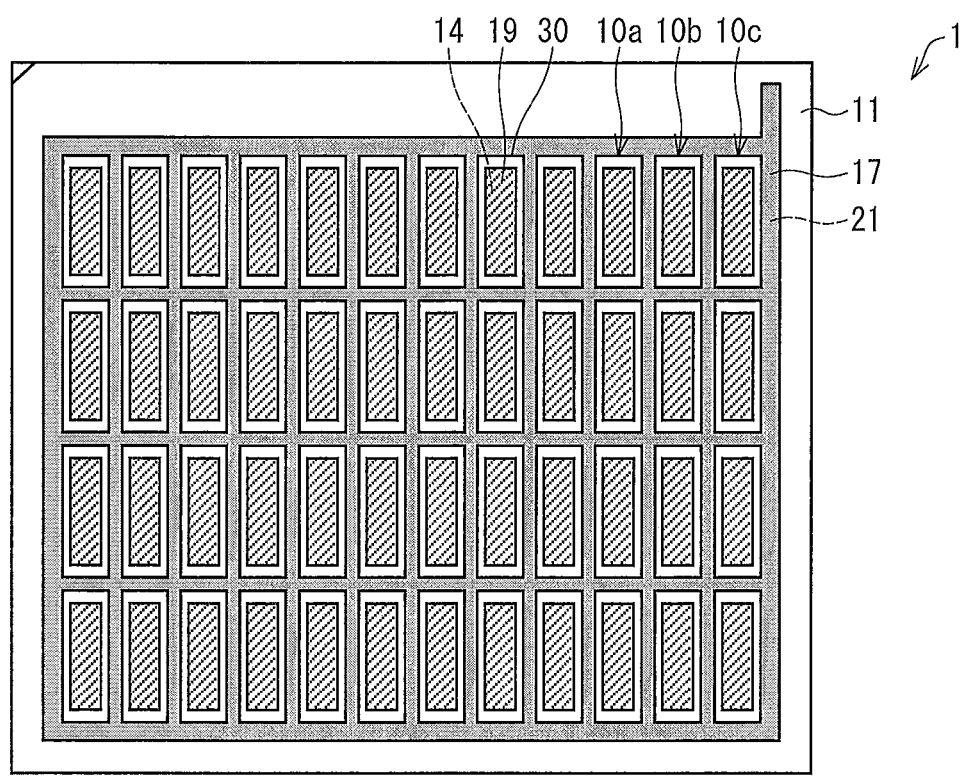

F I G. 8
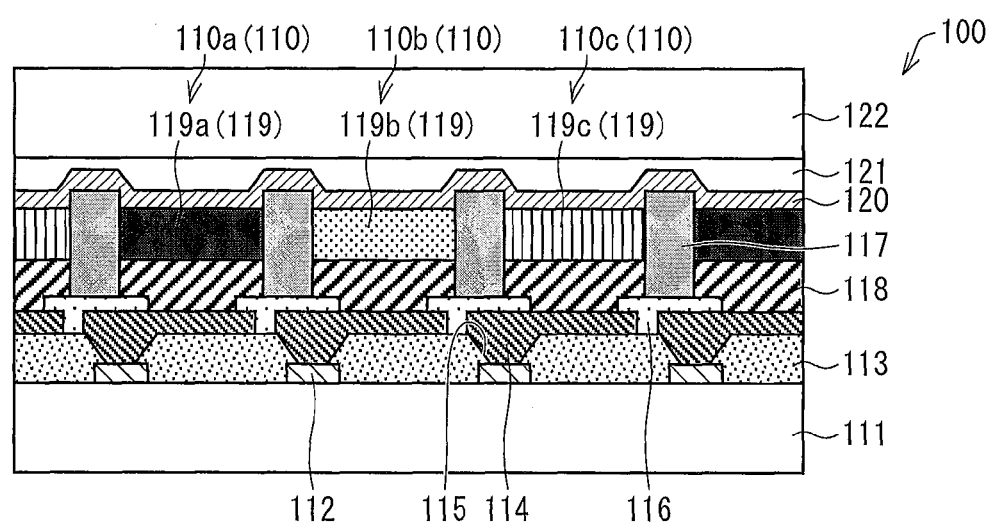

ORGANIC EL DEVICE, ELECTRONIC DEVICE, AND PROCESS FOR PRODUCTION OF ORGANIC EL DEVICE

CROSS REFERENCE TO RELATED APPLICATIONS

This is a U.S. National Phase patent application of PCT/JP2011/051492, filed Jan. 26, 2011, which claims priority to Japanese Patent Application No. 2010-124627, filed May 31, 2010, each of which is hereby incorporated by reference in the present disclosure in its entirety.

TECHNICAL FIELD

The present invention relates to an organic EL device, an electronic device, and a process for production of an organic EL device, particularly, to a flexible organic EL device, an electronic device, and a process for production of a flexible organic EL device.

BACKGROUND ART

These days, demand for flat panel displays has been increased with a shift to the highly-networked information society. As such displays, a non-self-luminous liquid crystal display (LCD), a self-luminous plasma display (PDP), an inorganic electroluminescence (inorganic EL) display, an organic electroluminescence (organic EL) display (for example, Patent Literature 1), etc. are known. Among these displays, especially an organic EL display attracts attention because an organic EL display is a self-luminous display and has features of a wide viewing angle, high contrast, high speed of response, and the like, which features are not found in an LCD.

With reference to FIG. 8, the following discusses a general organic EL device which is applied to an electronic device such as an organic EL display. FIG. 8 is a cross sectional view schematically illustrating a configuration of a substantial part of a conventional organic EL device.

As illustrated in FIG. 8, an organic EL device 100 includes, as organic EL elements 110, an organic EL element 110a emitting red light, an organic EL element 110b emitting green light, and an organic EL element 110c emitting blue light. The organic EL element 110a, the organic EL element 110b, and the organic EL element 110c constitute one unit arranged in a matrix pattern, and luminescence regions of the organic EL elements 110 are defined by a dividing wall (bank) 117. Note that, each of the organic EL elements 110 includes a lower electrode (anode) 114, a hole transport layer 118, a light-emitting layer 119, an upper electrode (cathode) 120, and the like.

More specifically, in the organic EL device 100, a plurality of TFTs (Thin Film Transistor) 112 which serve as driving elements are provided on an insulation substrate 111 made of a glass substrate and the like. An interlayer insulation film 113 made of silicon oxide ($SiO_2$), silicon nitride (SiN), and the like is provided on the entire insulation substrate 111 so as to cover the TFTs 112, and the lower electrodes 114 made of an electrode material with large work function such as ITO (Indium Tin Oxide) and IZO (Indium Zinc Oxide) are provided thereon in such a manner as to correspond to the TFTs 112, respectively. Note that, the interlayer insulation film 113 has a plurality of contact holes 115, depending on the number of the TFTs 112, and the lower electrodes 114 penetrating the interlayer insulation film 113 are electrically connected to the TFTs 112 in the contact holes 115, respectively.

A plurality of edge covers 116 made of an insulation material such as silicon oxide ($SiO_2$) are provided so as to cover boundaries between the adjacent lower electrodes 114, and the dividing wall 117 made of an organic resin material such as an acrylic resin is formed thereon. Note that, the dividing wall 117 is formed by applying an acrylic material by spin coating, and exposing and developing the acrylic material by photolithography.

On the edge covers 116 in the respective spaces defined by the dividing wall 117, the hole transport layers 118 made of oxide such as vanadium oxide ($V_2O_5$) and molybdenum oxide ($MoO_2$) are provided, and a light-emitting layer 119a emitting red light, a light-emitting layer 119b emitting green light, and a light-emitting layer 119c emitting blue light are provided thereon as light-emitting layers 119 respectively. That is, the dividing wall 117 divides the light-emitting layers 119 of the plurality of organic EL elements 110. The upper electrode (cathode) 120 is provided on the entire insulation substrate 111 so as to cover the light-emitting layers 119 and the dividing wall 117. Specifically, the upper electrode 120 spreads over the areas of the light-emitting layers 119 defined by the dividing wall 117 and over the dividing wall 117 so that the upper electrode 120 is shared in common by a plurality of the organic EL elements 110.

On the upper electrode 120, a sealing resin 121 is adhered, and a sealing substrate 122 made of a glass substrate, etc. is provided thereon. In this way, the organic EL elements 110 are sealed by attaching the insulation substrate 111 to the sealing substrate 122. This configuration can prevent the organic EL elements 110 from being damaged by oxygen and water.

CITATION LIST

Patent Literature

Patent Literature 1: Japanese Patent Application Publication, Tokukai, No. 2006-185789 A (Publication Date: Jul. 13, 2006)

SUMMARY OF INVENTION

Technical Problem

In such organic EL device 100, the dividing wall 117 is made of an organic resin material, and this raises various problems.

First, disconnection can occur in the upper electrode 120 which covers the dividing wall 117 because an organic resin material is an insulator.

Further, adhesiveness of an organic resin film to a base ($SiO_2$, etc.) is generally lower than that of a sputter film or a CVD (Chemical Vapor Deposition) film. Therefore, the dividing wall 117 made of an organic resin material is easy to come off and can damage the organic EL elements 110.

Further, one of the methods for forming the dividing wall 117 made of an organic resin material is photolithography, in which a pattern film with a desired height is formed by exposing, developing, and burning a photosensitive photoresist. However, in a case of using this method, it is difficult to form a thick photoresist resin film in terms of materials and the film thickness is generally as low as 1 to 4 µm. Besides, a photoresist resin film has high elastic modulus even after burning, and accordingly rolling or pressing a display panel may cause collision.

Specifically, the organic EL elements 110 are sealed by attaching the insulation substrate 111 to the sealing substrate 122 as described above. Sealing methods include a method for sealing the entire organic EL elements 110 with a sealing resin applied on the periphery of the sealing substrate 122, and a method for sealing the organic EL elements 110 individually by attaching the insulation substrate 111 to the sealing substrate 122 with a sealing resin or adhesive filled between the two substrates as illustrated in FIG. 8. Out of these methods, in the former method, hollow parts are formed over the organic EL elements 110. If the width of the hollow parts, that is, the distance between the organic EL elements 110 and the sealing substrate 122 is not enough, pressing or bending the organic EL device 100 can deform the insulation substrate 111 or the sealing substrate 122, so that the organic EL elements 110 in the hollow parts contact with the sealing substrate 122, causing collision. Collision may damage the organic EL elements 110 and adversely affect display quality. Further, in the latter method, the insulation substrate 111 dose not directly contact with the sealing substrate 122 because a sealing resin or adhesive is filled between the two substrates. However, meanwhile, in a case where the organic EL device 100 is pressed or bent, pressure or stress on the sealing substrate 122 is conveyed to the organic EL elements 110 via the sealing resin or adhesive. Besides, the stress of the sealing resin or adhesive itself is conveyed to the organic EL elements 110. Moreover, stress caused by the difference in thermal expansion coefficient among the two substrates and the sealing resin or adhesive is conveyed to the organic EL elements 110. Pressure or stress applied on the organic EL elements 110 may damage the organic EL elements 110 and adversely affect display quality. In the organic EL device 100 which is highly flexible, the latter sealing method raises more serious problems.

As described above, it is generally difficult to form a thick photoresist resin film in terms of materials. Even if there is a photoresist which can form a 10 μm-thick photoresist resin film for example, materials are limited to particular ones and cost more. This leads to the high-cost organic EL device 100.

Further, it is difficult to form a photoresist resin film with a high cross sectional aspect ratio (height/line width) in terms of materials. Therefore, formation of a photoresist resin film with a predetermined height requires a wide line width. This drops an open area ratio of pixels, and fails to achieve high definition. For example, in a case where the height of the dividing wall 117 is set to 10 μm and the line width is set to 10 μm, the cross sectional aspect ratio requires to be 1. This cross sectional aspect ratio is generally difficult to be achieved. Even if there is a photoresist which can achieve the cross sectional aspect ratio, materials are limited to particular ones and cost more. This leads to the high-cost organic EL device 100. Further, formation of a thick photoresist resin film with a thickness of 10 μm or so while keeping a high cross sectional aspect ratio requires a photoresist having an almost vertical taper. Herein, a taper indicates an angle formed between a side surface of a photoresist and a substrate, and an angle less than 90° is referred to a forward taper, and an angle more than 90° is referred to an inverse taper. In a case of a forward taper or an inverse taper, line width becomes narrower toward a ceiling part or a bottom part, so that it is difficult to obtain a desired height and line width. For this reason, a photoresist having an almost vertical taper is used, however, when the upper electrode 120 is deposited, less amount of the upper electrode 120 adheres to a side surface of the photoresist, and resultingly the upper electrode 120 is easily disconnected on a side surface of the dividing wall 117.

As described above, a conventional organic EL device suffers various problems resulting from a dividing wall made of a resin.

The present invention has been made in view of the above problems, and an object of the present invention is to provide an organic EL device, an electronic device, and a process for production of an organic EL device, each of which rarely suffers disconnection and so is highly reliable.

Furthermore, an object of the present invention is to provide an organic EL device, an electronic device, and a process for production of an organic EL device, each of which can achieve lower costs and higher definition.

Solution to Problem

In order to attain the above object, an organic EL device of the present invention is an organic EL device having a plurality of luminescence regions, including: a substrate; a plurality of lower electrodes on the substrate, the plurality of lower electrodes corresponding to the luminescence regions, respectively; a dividing wall formed so as to surround the luminescence regions; light-emitting layers formed on the plurality of lower electrodes in the luminescence regions, respectively; and an upper electrode formed on the dividing wall and the light-emitting layers, the dividing wall being conductive and connected to the upper electrode electrically.

According to the above configuration, the dividing wall and the upper electrode are electrically connected to each other, and this makes it possible to prevent disconnection of the upper electrode due to the dividing wall, and lower the resistance of the upper electrode.

Thus, a highly reliable organic EL device in which disconnection is difficult to happen can be provided.

An electronic device of the present invention includes the organic EL device.

Thus, a highly reliable electronic device in which disconnection is difficult to happen can be provided.

A process for production of an organic EL device of the present invention is a process for production of an organic EL device having a plurality of luminescence regions, comprising the steps of: forming a plurality of lower electrodes on a substrate so that the plurality of lower electrodes correspond to the luminescence regions, respectively, and at a same time, forming, between adjacent ones of the plurality of lower electrodes, a base electrode made of a same material as the plurality of lower electrodes; forming a dividing wall on the base electrode by electroplating in such a manner as to surround the luminescence regions; forming light-emitting layers on the lower electrodes in the luminescence regions, respectively; and forming an upper electrode on the dividing wall and the light-emitting layers so that the upper electrode is electrically connected to the dividing wall.

According to the above process, the dividing wall and the upper electrode are electrically connected to each other, and this makes it possible to prevent disconnection of the upper electrode due to the dividing wall, and lower resistance of the upper electrode.

Further, compared with a conventional dividing wall made of an organic resin, the dividing wall is highly adhesive to a base and difficult to come off. This makes it possible to prevent organic EL elements from being damaged by a coming off film.

Further, since it is easy to make the dividing wall thicker, the organic EL elements can be prevented from contacting with a sealing substrate. In addition, since elastic modulus of the dividing wall is smaller than that of a dividing wall made of an organic resin, the organic EL elements are difficult to be deformed. Therefore, this makes it possible to prevent the organic EL elements from being damaged.

Further, electroplating is a method which has been conventionally conducted in many fields, and is capable of lowering costs.

Further, since the dividing wall is formed only on the base electrode, it is possible to control the line width of the dividing wall freely. Therefore, a pixel open area ratio is not lowered, and it is possible to realize high definition.

Advantageous Effects of Invention

An organic EL device of the present invention is an organic EL device having a plurality of luminescence regions, including: a substrate; a plurality of lower electrodes formed on the substrate, the plurality of lower electrodes corresponding to the luminescence regions, respectively; a dividing wall formed so as to surround the luminescence regions; light-emitting layers formed on the plurality of lower electrodes in the luminescence regions, respectively; and an upper electrode formed on the dividing wall and the light-emitting layers, the dividing wall being conductive and connected to the upper electrode electrically.

An electronic device of the present invention includes the organic EL device.

A process for production of an organic EL device of the present invention is a process for production of an organic EL device having a plurality of luminescence regions, comprising the steps of: forming a plurality of lower electrodes on a substrate so that the plurality of lower electrodes correspond to the luminescence regions, respectively, and at a same time, forming, between adjacent ones of the plurality of lower electrodes, a base electrode made of a same material as the plurality of lower electrodes; forming a dividing wall on the base electrode by electroplating in such a manner as to surround the luminescence regions; forming light-emitting layers on the lower electrodes in the luminescence regions, respectively; and forming an upper electrode on the dividing wall and the light-emitting layers so that the upper electrode is electrically connected to the dividing wall.

Therefore, it is possible to provide an organic EL device, an electronic device, and a process for production of an organic EL device, each of which rarely suffers disconnection and so is highly reliable.

BRIEF DESCRIPTION OF DRAWINGS

FIG. 3 is a plan view schematically illustrating a configuration of a substantial part of an organic EL device in accordance with Embodiment 1 of the present invention.

FIG. 8 is a cross sectional view schematically illustrating a configuration of a substantial part of a conventional organic EL device.

DESCRIPTION OF EMBODIMENTS

Embodiments of the present invention are described in detail as below.

Embodiment 1

The following discusses an embodiment of the present invention with reference to drawings. An organic EL device of the present invention is applicable to various electronic devices such as a television display, a mobile phone display, and a PC display.

(Cross Sectional Configuration of Organic EL Device)

First, a cross sectional configuration of an organic EL device in accordance with the present embodiment is described with reference to FIG. 1.

Figure 1:
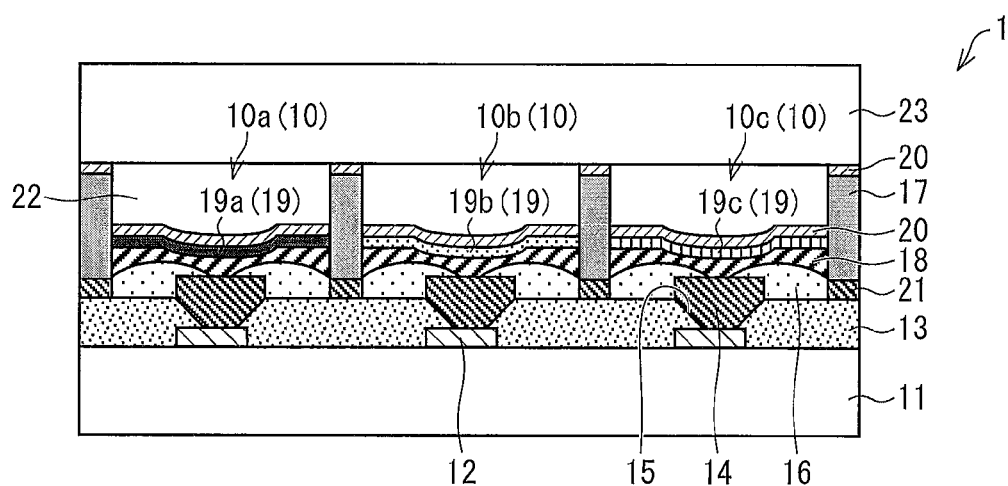
FIG. 1 is a cross sectional view schematically illustrating a configuration of a substantial part of an organic EL device in accordance with Embodiment 1 of the present invention.

FIG. 1 is a cross sectional view schematically illustrating a configuration of a substantial part of the organic EL device in accordance with the present embodiment.

As illustrated in FIG. 1, an organic EL device 1 includes, as organic EL elements 10, an organic EL element 10a emitting red light, an organic EL element 10b emitting green light, and an organic EL element 10c emitting blue light. The organic EL element 10a, the organic EL element 10b, and the organic EL element 10c constitute one unit arranged in a matrix pattern, and luminescence regions of the organic EL elements 10 are defined by a dividing wall (bank) 17 which is conductive. Note that, each of the organic EL elements 10 includes a lower electrode (anode) 14, a hole transport layer 18, a light-emitting layer 19, an upper electrode (cathode) 20, and the like.

More specifically, in the organic EL device 1, a plurality of TFTs 12 for driving the organic EL elements 10 are provided on an insulation substrate 11 at a predetermined interval.

Examples of the insulation substrate 11 include an inorganic-material substrate made of glass, quartz or the like, and a plastic substrate made of polyethylene terephthalate, polycarbazole, polyimide, or the like.

The TFTs 12 can be formed with publicly-known materials by publicly-known methods.

An interlayer insulation film 13 is provided on the entire insulation substrate 11 so as to cover the TFTs 12, and the lower electrodes 14 made of an electrode material with large work function are provided thereon in such a manner as to correspond to the TFTs 12, respectively. The interlayer insulation film 13 has a plurality of contact holes 15, depending on the number of the TFTs 12, and the lower electrodes 14 penetrating the interlayer insulation film 13 are electrically connected to the TFTs 12 in the respective contact holes 15.

Note here that the interlayer insulation film 13 can be formed with publicly-known materials (inorganic materials or organic materials). Examples of the inorganic materials include silicon oxide ($SiO_2$), silicon nitride (SiN or $Si_2N_4$), and tantalum oxide (TaO or $Ta_2O_5$). Examples of the organic materials include an acrylic resin and a resist material.

Also, the lower electrodes 14 can be formed with publicly-known electrode materials with large work function. Examples of transparent electrode materials include metals such as gold (Au), platinum (Pt), and nickel (Ni), oxide (ITO)

compounded from indium (In) and tin (Sn), oxide ($SnO_2$) of tin (Sn), and oxide (IZO) compounded from indium (In) and zinc (Zn). These materials enable more efficient injection of electron holes into the light-emitting layers 19 (described later).

On the interlayer insulation film 13, a base electrode 21 for forming the dividing wall 17 is provided between the adjacent lower electrodes 14 at a predetermined interval, and edge covers 16 are formed in such a manner as to partially expose the respective lower electrodes 14 and the base electrode 21.

Note here that, the base electrode 21 is preferably formed at the same time and with the same material as the lower electrodes 14. Thus, the base electrode 21 for forming the dividing wall 17 can be formed without an additional process.

Also, the edge covers 16 can be formed with publicly-known insulative materials which transmit light, such as SiO, SiON, SiN, SiOC, SiC, HfSiON, ZrO, HfO, and LaO.

On the base electrode 21, a plating bank serving as the dividing wall 17 is formed by electroplating in which an electrolyte aqueous solution is electrolyzed. Note here that, electroplating is defined, in Japanese Industrial Standards "JISH0400:1998-1011 Glossary of terms used in electroplating and related processes", as a method for electrochemically depositing (electrodepositing) a metal on a surface of a metal or nonmetal. For example, a plating bank made of copper (Cu) can be formed on the base electrode 21 by electroplating in which an electrolyte aqueous solution into which copper sulfate or copper cyanide has been poured is electrolyzed. However, the plating bank is not limited to this, and can be formed with at least one of metals such as nickel (Ni), zinc (Zn), chromium (Cr), aluminum (Al), and the like.

The dividing wall 17 is formed on the base electrode 21 by electroplating. Therefore, it is possible to control its line width freely and achieve high definition.

The hole transport layers 18 are formed on the edge covers 16 in the respective spaces defined by the dividing wall 17. On the hole transport layers 18, a light-emitting layer 19a emitting red light, a light-emitting layer 19b emitting green light, and a light-emitting layer 19c emitting blue light are formed respectively as the light-emitting layers 19. That is, the dividing wall 17 divides the light-emitting layers 19 of a plurality of the organic EL elements 10.

Note here that, the hole transport layers 18 can be made of publicly-known materials. Examples of the materials include porphyrin derivative, aromatic tertiary amin compound, styrylamine derivative, polyvinycarbozole, poly-p-phenylene vinylene, polysilane, triazole derivative, oxadiazole derivative, imidazole derivative, polyarylalkane derivative, pyrazoline derivative, pyrazolone derivative, fluorenone derivative, hydrogenated amorphous silicon, hydrogenated amorphous silicon carbide, zinc sulfide, and zinc selenide.

Further, the light-emitting layers 19 are made of a material with high luminous efficiency, and have a function of emitting light by recombining electron holes and electrons which are injected from the lower electrodes 14 and the upper electrode 20 respectively upon application of a voltage to the two electrodes and deactivating the energy. Specific examples of materials for the light-emitting layers 19 include metal oxinoid compound [8-hydroxyquinoline metal complex], naphthalene derivative, anthracene derivative, diphenylethylene derivative, vinylaceton derivative, triphenylamine derivative, butadiene derivative, coumarin derivative, benzoxadole derivative, oxadiazole derivative, oxadole derivative, benzimidazole derivative, thiadiazole derivative, perylene derivative, perinone derivative, rhodamine derivative, phenoxazone, quinacridone derivative, rubrene, poly-p-phenylene vinylene, and polysilane.

The upper electrode (cathode) 20 made of a material with small work function is formed on the entire insulation substrate 11 so as to cover the light-emitting layers 19 and the dividing wall 17. That is, the upper electrode 20 spreads over the luminescence regions of the light-emitting layers 19 which are defined by the dividing wall 17 and over the dividing wall 17 so that the upper electrode 20 is shared in common by a plurality of the organic EL elements 10. Note that, the upper electrode 20 and the dividing wall 17 are electrically connected to each other.

Note here that, the upper electrode 20 can be made of publicly-known materials with small work function. Examples of the materials include metallic materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (YB), and alloys such as lithium fluoride (LiF)/calcium (Ca)/aluminum (Al). These materials enable more efficient injection of electrons into the light-emitting layers 19.

A sealing substrate 23 made of a glass substrate and the like is provided on the upper electrode 20 formed on the dividing wall 17. The sealing substrate 23 is adhered to the upper electrode 20 with a sealing resin (not illustrated) applied on the periphery of the sealing substrate 23. The organic EL elements 10 are sealed by attaching the sealing substrate 23 to the insulation substrate 11. This prevents the organic EL elements 10 from being damaged by oxygen and water. Note that hollow parts 22 are formed between the organic EL elements 10 and the sealing substrate 23.

In the present embodiment, the organic EL device 1 is designed such that the lower electrodes 14 and the base electrode 21 serve as anodes, and the upper electrode 20 serves as a cathode. However, the present embodiment is not limited to such a structure. Alternatively, the laminated structure can be inverted in such a manner that the lower electrodes 14 and the base electrode 21 serve as cathodes, and the upper electrode 20 serves as an anode. In this laminated structure, the lower electrodes (cathode) 14, the light-emitting layers 19, the hole transport layers 18, and the upper electrode (anode) 20 are positioned in this order from the bottom, and the materials used for the lower electrodes 14 and the base electrode 21 and the material used for the upper electrode 20 are also inverted. For example, Al (aluminum) which has small work function can be used for the lower electrodes 14 and the base electrode 21 both of which serve as cathodes, and ITO which has large work function can be used for the upper electrode 20 which serves as an anode. Moreover, depending on desired characteristics, a hole injection layer, an electron transport layer, and an electron injection layer can be added to the laminated structure in the organic EL elements 10 as appropriate. Further, the hole transport layer can serve as a hole injection layer. In this way, various structures can be employed for the organic EL elements 10. Specifically, a structure for the organic EL elements 10 can be selected from the following structures (1) through (9). Anodes and cathodes are omitted in the structures below.

(1) light-emitting layer
(2) hole transport layer/light-emitting layer
(3) light-emitting layer/electron transport layer
(4) hole transport layer/light-emitting layer/electron transport layer
(5) hole injection layer/hole transport layer/light-emitting layer/electron transport layer
(6) hole injection layer/hole transport layer/light-emitting layer/electron transport layer/electron injection layer (7) hole injection layer/hole transport layer/light-emitting layer/hole prevention layer/electron transport layer (8) hole injection layer/hole transport layer/light-emitting layer/hole prevention layer/electron transport layer/electron injection layer (9) hole injection layer/hole transport layer/electron prevention layer/light-emitting layer/hole prevention layer/electron transport layer/electron injection layer Further, the organic EL device 1 can employ either of a bottom emission structure in which light is emitted outward from the insulation substrate 11 side or a top emission structure in which light is emitted outward from the side opposite to the insulation substrate 11 side. Note that, in a case of the top emission structure, it is necessary to obtain light from the upper electrode 20 by reflecting light on the lower electrodes 14 and the base electrode 21. On this account, for example, ITO layered on Al can be used for the lower electrodes 14 and the base electrode 21, and ITO layered on approximately 20 nm-thick translucent Ag can be used for the upper electrode 20. In this case, Al of the lower electrodes 14 and the base electrode 21 can play a reflection function, and ITO of the lower electrodes 14 and the base electrode 21 can play a function of injecting electron holes into the light-emitting layers 19, while Ag of the upper electrode 20 can play a function of injecting electrons into the light-emitting layers 19, and ITO of the upper electrode 20 can play a function of a subsidiary electrode which lowers the resistance of cathode.

(Plan Configuration of Organic EL Device)

Figure 2:
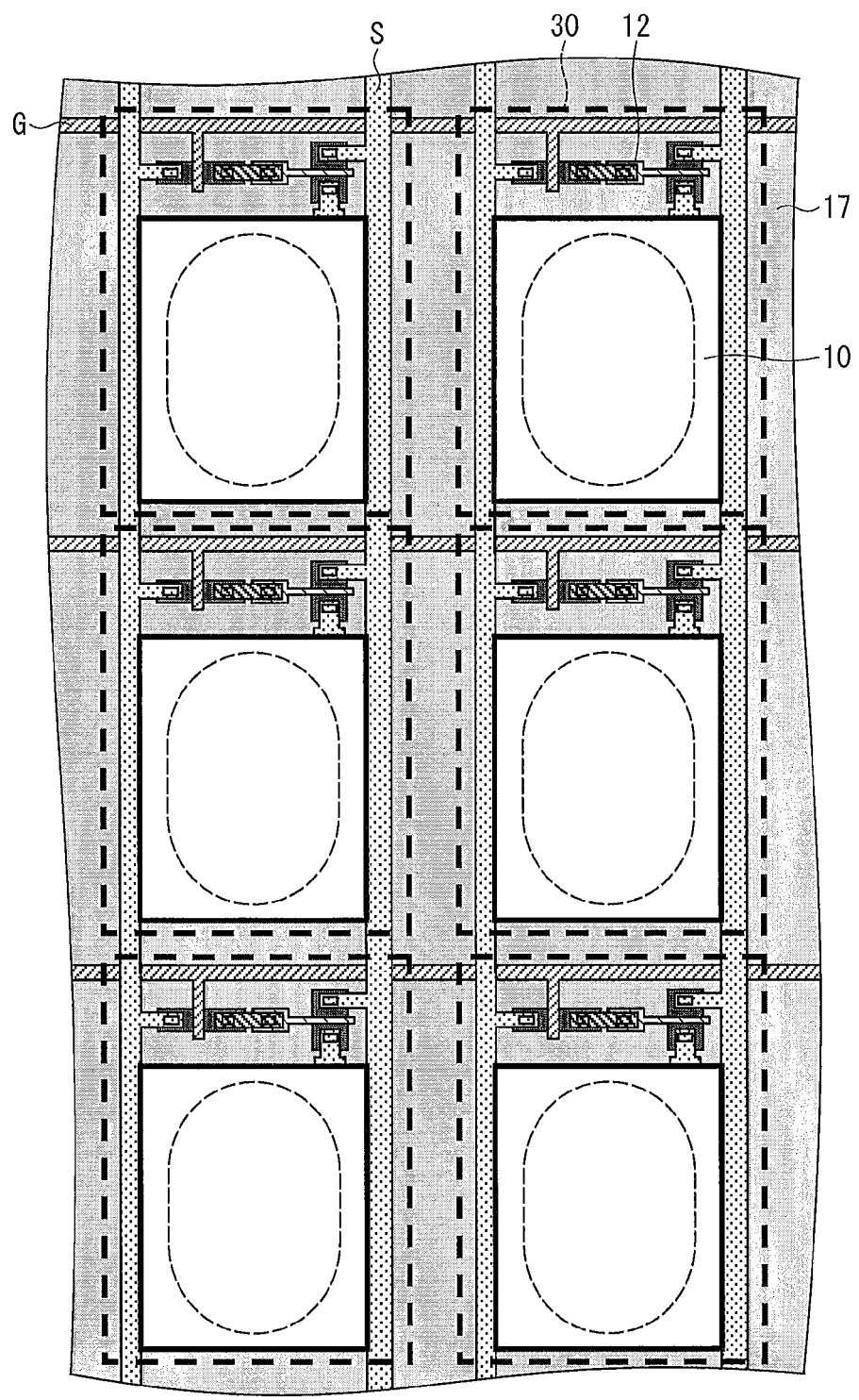
FIG. 2 is a plan view schematically illustrating a configuration of a substantial part of an organic EL device in accordance with Embodiment 1 of the present invention.

The following discusses a plan configuration of the organic EL device in accordance with the present embodiment with reference to FIG. 2.

FIG. 2 is a plan view schematically illustrating a configuration of a substantial part of the organic EL device in accordance with the present embodiment.

As illustrated in FIG. 2, in the display regions of the organic EL device 1, a plurality of gate wirings G and a plurality of source wirings S are arranged to cross each other, and pixels 30 are provided in such a manner as to correspond to the intersections of the gate wirings G and the source wirings S.

Note that, each of the pixels 30 contains one of the organic EL element 10a emitting red light, the organic EL element 10b emitting green light, and the organic EL element 10c emitting blue light, and further includes the TFT 12 which serves as a driving element. The gate electrode of the TFT 12 is connected to the gate wiring G, and the source electrode of the TFT 12 is connected to the source wiring S, and the drain electrode of the TFT 12 is connected to the lower electrode 14. The organic EL elements 10 are driven by respective TFTs 12.

Further, the display regions of a plurality of pixels 30 are defined by the plating bank which serves as the dividing wall 17.

(Configuration of Dividing Wall)

The following further discusses the details of the configuration of the dividing wall in the organic EL device in accordance with the present embodiment with reference to FIG. 3.

FIG. 3 is a plan view schematically illustrating a configuration of a substantial part of the organic EL device in accordance with the present embodiment.

As illustrated in FIG. 3, in the organic EL device 1, the pixels 30 are arranged on the insulation substrate 11 in a matrix pattern, each of the pixels 30 containing any one of the organic EL element 10a emitting red light, the organic EL element 10b emitting green light, and the organic EL element 10c emitting blue light. Note that, each of the organic EL elements 10 is configured such that the lower electrode 14, the hole transport layer 18, the light-emitting layer 19, the upper electrode 20, and the like are layered (FIG. 1).

Between individual pixels 30, the base electrode 21 is formed at the same time and with the same material as the lower electrodes 14, and the dividing wall 17 is formed on the base electrode 21 by electroplating. That is, individual pixels 30 are surrounded by the plating bank which serves as the dividing wall 17.

The upper electrode 20 (not illustrated) is formed on the entire insulation substrate 11 so as to cover the light-emitting layers 19 and the dividing wall 17.

Note here that, as described above, the dividing wall 17 which is formed by electroplating can bring about the following effects.

First, since the plating bank which serves as the dividing wall 17 is conductive, the dividing wall 17 and the upper electrode 20 are electrically connected to each other. This enables preventing disconnection of the upper electrode 20 due to the dividing wall 17, and lowering the resistance of the upper electrode 20. For example, assume that the length of the pixel 30 is set to 450 µm, the width of the pixel 30 is set to 150 µm, the line width of the dividing wall 17 is set to 10 µm, the height (thickness) of the dividing wall 17 is set to 10 µm, the film thickness of the upper electrode 20 is set to 200 nm, and the conductivity of the dividing wall 17 is set to the same as the upper electrode 20. In this case, the height of the dividing wall 17 becomes 50 times as high as the film thickness of the upper electrode 20 and the area of the dividing wall 17 becomes $1.78 \times 10^{-3}$. Accordingly, the sheet resistance of the dividing wall 17 becomes approximately 11 times as high as the upper electrode 20. The dividing wall 17 and the upper electrode 20 are to be connected to each other in parallel, and thus the sheet resistance is reduced to 11/12=0.92 times. Note that, in a case of a structure in which the upper electrode 20 is thin, such as a top emission structure, the resistance is more remarkably reduced. For example, assume that the film thickness of the upper electrode 20 is set to 20 nm. In this case, the sheet resistance is reduced to 0.53 times. Further, it is possible to reduce the sheet resistance by increasing the height or the line width of the dividing wall 17. Note that, in a case where the same film thickness is to be obtained, processes of electroplating can easily increase the thickness of the dividing wall 17 in a period much shorter than a vapor deposition. Further, the dividing wall 17 can be formed by electroplating with materials which are more conductive than the upper electrode 20. Further, the base electrode 21 is formed as a base in order to conduct electroplating. This also makes it possible to reduce the sheet resistance.

Further, the plating bank serving as the dividing wall 17 can prevent the organic EL elements 10 from being damaged by a coming off film because the plating bank is highly adhesive and difficult to come off in comparison with a conventional dividing wall made of an organic resin.

Further, electroplating is a multipurpose technique which has been carried out in many fields conventionally, and also the materials for electroplating are not special. Thus, it is possible to lower costs.

Further, use of electroplating facilitates making the dividing wall 17 thicker, so that it is possible to prevent the organic EL elements 10 from being in contact with the sealing substrate 23. Further, elastic modulus of the plating bank is smaller than that of a dividing wall made of an organic resin. This makes it difficult for the dividing wall 17 to be deformed.

The following further discusses the present embodiment in detail with reference to specific examples of the present invention. However, the present invention is not limited to such examples. For the sake of convenience in explanations, the same signs are appended to the members which have the same functions as the members recited in the embodiment.

Example 1

Figure 4:
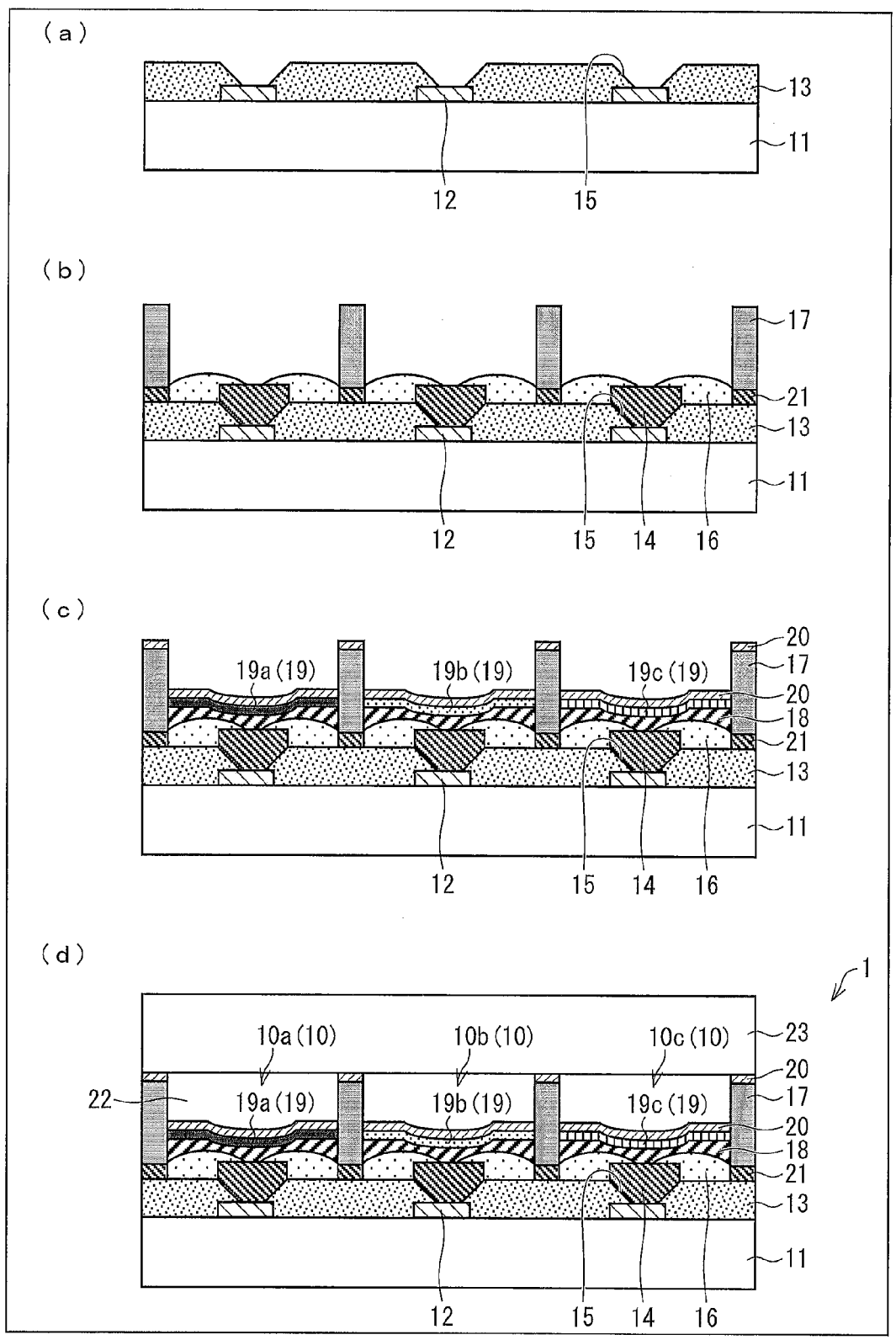
FIG. 4 is a cross sectional view for explaining manufacturing processes of an organic EL device in accordance with Embodiment 1 of the present invention. (a) to (d) of FIG. 4 illustrate the manufacturing processes of an organic EL device in accordance with Embodiment 1 of the present invention.
Figure 5:
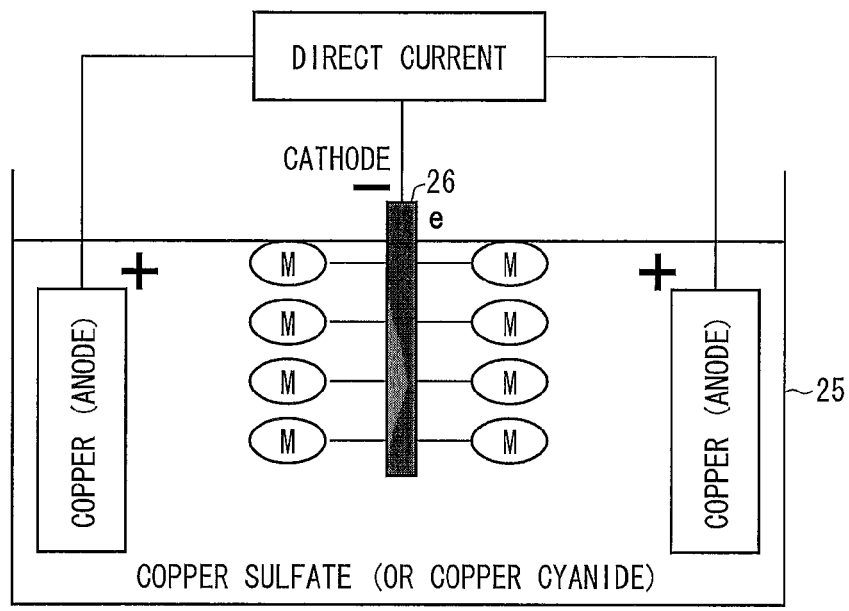
FIG. 5 is a view for explaining electroplating which forms a dividing wall in an organic EL device in accordance with Embodiment 1 of the present invention.

The following discusses a process of manufacturing the organic EL device in accordance with the present example with reference to FIGS. 4 and 5.

(a) to (d) of FIG. 4 are cross sectional views, each schematically illustrating a substantial part of the organic EL device in accordance with the present example. FIG. 5 is a view for explaining electroplating which forms a dividing wall in the organic EL device in accordance with the present example.

First, as illustrated in (a) of FIG. 4, a plurality of TFTs 12 for driving the respective organic EL elements 10 are formed at a predetermined interval on the insulation substrate 11 such as a glass substrate with a length of 400 mm, a width of 320 mm, and a thickness of 0.7 mm. Note that the TFTs 12 can be formed with publicly-known materials by publicly-known methods. Thereafter, a photosensitive acrylic resin is applied on the entire insulation substrate 11 by spin coating, and exposed and developed by photolithography to form the interlayer insulation film 13 having a plurality of the contact holes 15. These contact holes 15 partially expose the respective TFTs 12. The exposure is conducted at 360 J/cm$^3$ of luminous exposure and the development is conducted with an alkali developer in the present example, however, the present invention is not limited to the example. It is preferable that the film thickness of the interlayer insulation film 13 is approximately 2 μm, and the diameter of each of the contact holes 15 is approximately 5 μm. Thereafter, the interlayer insulation film 13 is burned for one hour at 220° C.

Next, as illustrated in (b) of FIG. 4, a 100 nm-thick ITO film is formed on the entire insulation substrate 11 by sputtering, and exposed and developed by photolithography, and then patterned by etching to form the lower electrodes 14 in such a manner as to correspond to the TFTs 12, respectively. Note that, the lower electrodes 14 penetrating the interlayer insulation film 13 are electrically connected to the TFTs 12 in the respective contact holes 15. At the same time, the base electrode 21 is formed with the same material as the lower electrodes 14. Thereafter, the lower electrodes 14 and the base electrode 21 are burned for one hour at 220° C.

Next, as illustrated in (b) of FIG. 4, a 150 nm-thick $SiO_2$ film is formed by sputtering at the ends of the lower electrodes 14 and the base electrode 21, and exposed and developed by photoresist, and then patterned by etching to form the edge covers 16. Note that the edge covers 16 are formed in such a manner as to partially expose the lower electrodes 14 and the base electrode 21.

Next, as illustrated in (b) of FIG. 4, the base electrode 21 is electrified so that the plating bank serving as the dividing wall 17 is formed by electroplating.

As illustrated in FIG. 5, a specific method for forming the plating bank which serves as the dividing wall 17 is as follows. A hook jig 26 is hung in a stationary tank 25 into which copper sulfate or copper cyanide has been poured as an electrolyte aqueous solution, and the base electrode 21 is hooked on the hook jig 26. At application of a direct current to both the base electrode 21 as cathode and copper rods as anodes, copper cations are electrodeposited only on a part of the base electrode 21 on which part a direct current is applied, so that the plating bank is formed. At this time, it is preferable that the film thickness of the plating bank which serves as the dividing wall 17 is approximately 10 μm.

Next, as illustrated in (c) of FIG. 4, the hole transport layers 18 and the light-emitting layers 19 are formed on the edge covers 16 in the respective spaces defined by the dividing wall 17. Further, the upper electrode 20 is formed on the entire insulation substrate 11 so as to cover the light-emitting layers 19 and the dividing wall 17. Note that, since the hole transport layers 18, the light-emitting layers 19, and the upper electrode 20 are formed by known processes, explanations for the processes are omitted.

Next, as illustrated in (d) of FIG. 4, an UV cure resin or a thermosetting resin is applied on the periphery of the sealing substrate 23, and the sealing substrate 23 made of a glass substrate and the like is attached to the insulation substrate 11 in the inert gas atmosphere, so that the organic EL elements 10 are sealed. Accordingly, the hollow parts 22 are formed between the organic EL elements 10 and the sealing substrate 23. Note that, the sealing substrate 23 is attached with desiccant in advance, and this makes it possible to more efficiently reduce degradation of the organic EL elements 10 due to moisture.

In accordance with the foregoing processes, the organic EL device 1 is manufactured.

Example 2

Figure 6:
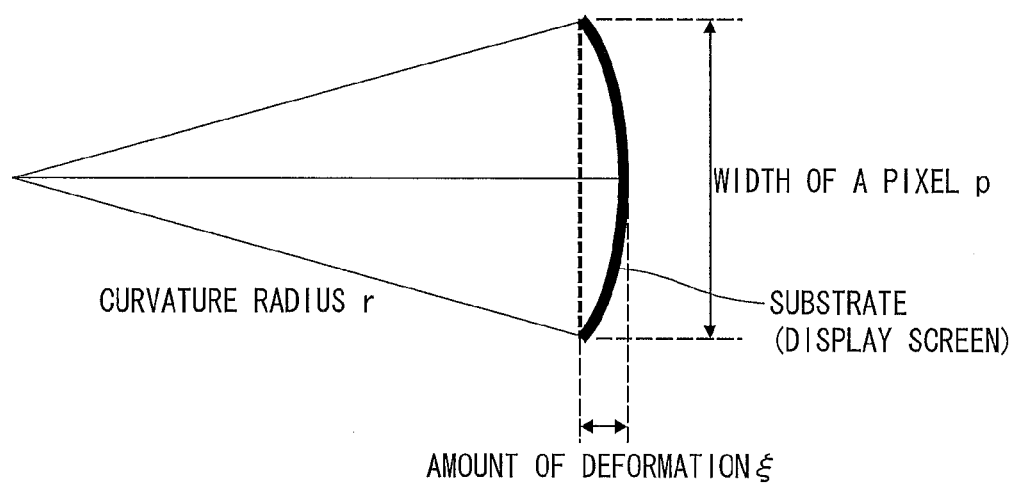
FIG. 6 is a view for explaining the amount of deformation caused by rolling a display panel in an organic EL device.

The following discusses another example related to the organic EL device of the present invention with reference to FIG. 6.

Note that, for the sake of convenience in explanations, the same signs are appended to the members which have the same functions as the drawings recited in the example 1 and explanations for the members are omitted.

The organic EL device 1 in accordance with the present example is an organic EL device which has a flexible display panel.

That is, flexible substrates are used for the insulation substrate 11 and the sealing substrate 23 in the organic EL device 1. Specifically, the substrates are plastic substrates made of polyethylene terephthalate, polyethylene naphthalate, polycarbazole, polyimide, and the like.

When the dividing wall 17 is formed with an organic resin as conventionally, it is difficult to form a thick resin film in terms of materials, and generally the thickness is as low as 2 μm or so. Further, it is difficult to form a pattern with a high cross sectional aspect ratio (height/line width) in terms of materials, and it is preferable that the line width of the dividing wall 17 which is formed in non-luminescence regions is as narrow as possible.

Accordingly, in the organic EL device 1 having a flexible display panel, it was calculated how much pixels are deformed by rolling the display panel and at least how high the dividing wall 17 needs to be, by using the following definition.

Note that, in the organic EL device 1 having a flexible display panel, the amount of deformation ξ caused by rolling the display panel is defined as below.

FIG. 6 is a view for explaining the amount of deformation caused by rolling the display panel in the organic EL device.

As illustrated in FIG. 6, when the display panel of the organic EL device 1 is deformed at curvature radius r, the amount of deformation ξ which occurs in the width p of a pixel is shown as below.

$$\xi = r - \sqrt{r^2 - \left(\frac{p}{2}\right)^2}$$ [Formula 1]

Assume for example that r is 1 cm and a pixel pitch is 450 µm in length×150 µm in width. In this case, ξ is 2.53 µm in length and ξ is 0.28 µm in width. That is, in a case where the display panel of the organic EL device 1 is rolled at curvature radius r, the substrates which constitute the display panel bend by at least 2.53 µm in each pixel.

By the way, in a case where the display panel is constituted by attaching the sealing substrate 23 to the insulation substrate 11 on which the organic EL elements 10 are formed, it is desirable that the two substrates are bendable by at least the foregoing amount. In a case where the two substrates bend in the same direction, the distance between the sealing substrate 23 and the insulation substrate 11 is not changed. However, the two substrates can bend in the opposite directions. In this case, the distance between the two substrates is shorter by the double of the foregoing amount of deformation ξ. That is, the distance between the two substrates can be shorter by at least 5.06 µm.

In a case where spacers are formed in the non-luminescence regions of the pixels and the sealing substrate 23 is attached to the insulation substrate 11 with a certain distance therebetween, spaces are provided over the organic EL elements 10 in the luminescence regions. When the display panel is flat without being rolled, a certain distance is kept between the organic EL elements 10 and the sealing substrate 23. However, when the display panel is rolled or changed into shapes other than flat, deformation as mentioned above occurs and the distance between the organic EL elements 10 and the sealing substrate 23 can be shorter. In the case of the above example, if the distance between the organic EL elements 10 and the sealing substrate 23 is 5.06 µm or less, the sealing substrate 23 may contact with the organic EL elements 10 because of deformation. When such contact happens, the electrode materials or the organic materials which constitute the organic EL elements are damaged, and this causes degradation of the pixels and adversely affects display quality.

Therefore, it is necessary that the distance between the organic EL elements 10 and the sealing substrate 23 is set to a value which does not allow the sealing substrate 23 to contact with the organic EL elements 10. Further, it is desirable that the distance between the organic EL elements 10 and the sealing substrate 23 is kept longer in view of occurrence of temporary deformation more than normal curvature radius or locally strong deformation caused by pressure.

As described above, in a case where the dividing wall is formed with an organic resin material as conventionally, the dividing wall 17 is not applicable to an organic EL device having a flexible display panel because various problems arise.

In order to deal with these problems, in the present invention, the plating bank which serves as the dividing wall 17 is formed, and this makes it possible to form a pattern with a high cross sectional aspect ratio (height/line width). Therefore, the present invention is suitable for an organic EL device having a flexible display panel.

Embodiment 2

Another embodiment as to the organic EL device of the present invention is described.

Note that, for the sake of convenience in explanations, the same signs are appended to the members which have the same functions as the drawings recited in the embodiment 1.

An organic EL device 2 in accordance with the present embodiment has the same configuration as the organic EL device 1 in accordance with the embodiment 1 illustrated in FIG. 1. However, a method for forming the dividing wall 17 is different. That is, in Embodiment 1, the dividing wall 17 is formed by electroplating, whereas in Embodiment 2, the dividing wall 17 is formed by electroless plating.

Specifically, the plating bank which serves as the dividing wall 17 is formed on the base electrode 21 by electroless plating. Note here that, electroless plating is defined, in Japanese Industrial Standards "JISH0400:1998-6001 Glossary of terms used in electroless plating and related processes", as a method for reducing and depositing metals chemically without the use of exterior power supply. For example, a plating bank made of copper (Cu) can be formed on the base electrode 21 by electroless plating conducted by reductional reaction in a solution into which copper sulfate or copper cyanide has been poured. However, the present embodiment is not limited to this, and a plating bank can be formed with at least any one of metals such as nickel (Ni), zinc (Zn), chromium (Cr), and aluminum (Al).

The following further discusses the present embodiment in detail with reference to a specific example of the present invention. However, the present invention is not limited to such an example. For the sake of convenience in explanations, the same signs are appended to the members which have the same functions as the members recited in the embodiment.

Example 3

Figure 7:
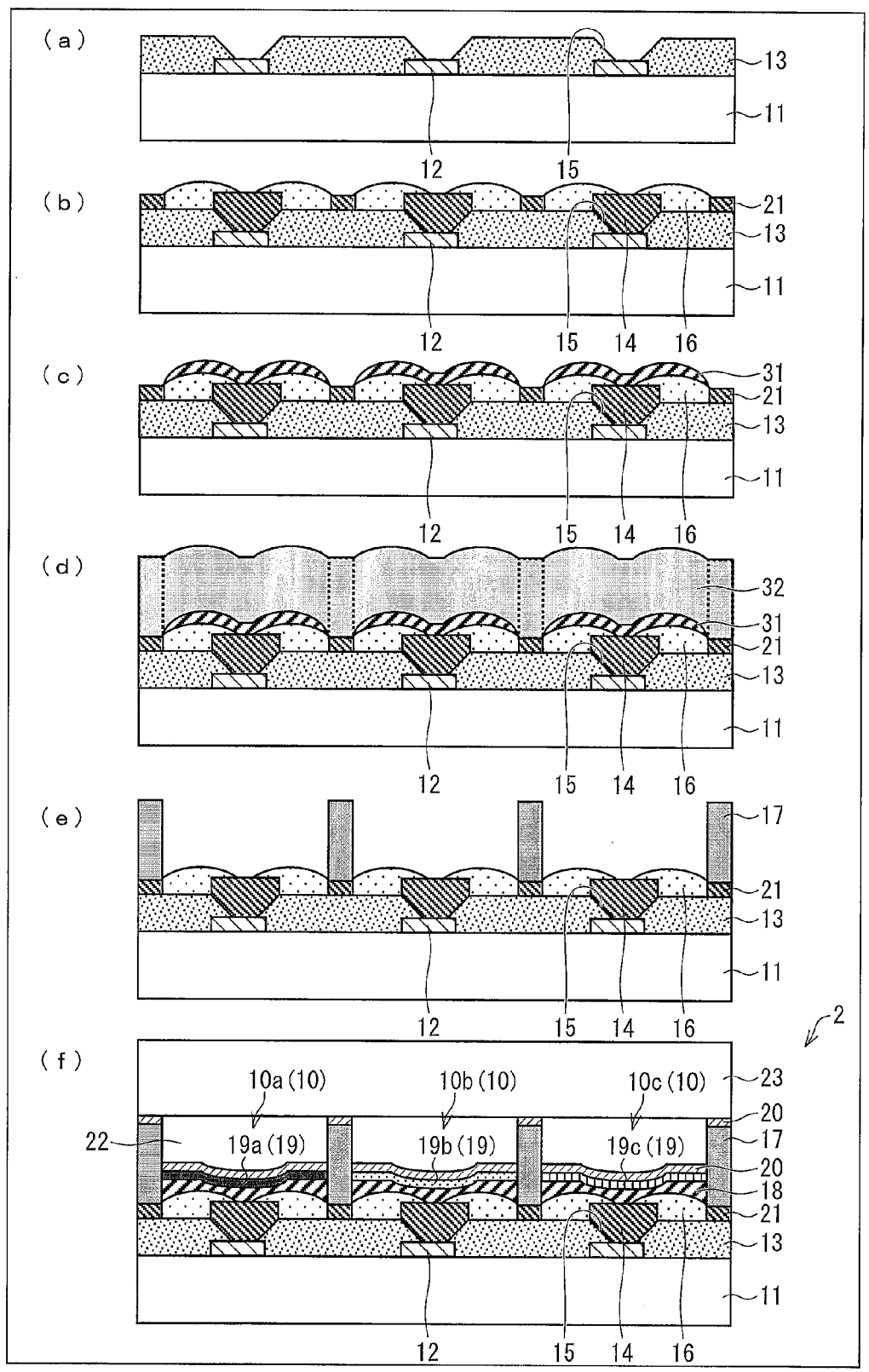
FIG. 7 is a cross sectional view for explaining manufacturing processes of an organic EL device in accordance with Embodiment 2 of the present invention. (a) to (f) of FIG. 7 illustrate the manufacturing processes of an organic EL device in accordance with Embodiment 2 of the present invention.

With reference to FIG. 7, the following discusses a manufacturing process of the organic EL device 2 in accordance with the present example.

(a) to (f) of FIG. 7 are cross sectional views, each schematically illustrating a substantial part of the organic EL device 2 in accordance with the present example.

First, as illustrated in (a) of FIG. 7, a plurality of TFTs 12 for driving the respective organic EL elements 10 are formed at a predetermined interval on the insulation substrate 11 such as a glass substrate with a length of 400 mm, a width of 320 mm, and a thickness of 0.7 mm. Note that the TFTs 12 can be formed with publicly-known materials by publicly-known methods. Thereafter, a photosensitive acrylic resin is applied on the entire insulation substrate 11 by spin coating, and exposed and developed by photolithography to form the interlayer insulation film 13 having a plurality of contact holes 15. These contact holes 15 partially expose the respective TFTs 12. In the present example, the exposure is conducted at 360 J/cm$^3$ of luminous exposure and the development is conducted with an alkali developer. However, the present invention is not limited to the example. It is preferable that the film thickness of the interlayer insulation film 13 is approximately 2 µm, and the diameter of each of the contact holes 15 is approximately 5 µm. Thereafter, the interlayer insulation film 13 is burned for one hour at 220° C.

Next, as illustrated in (b) of FIG. 7, a 100 nm-thick ITO film is formed on the entire insulation substrate 11 by sputtering, and exposed and developed by photolithography, and then patterned by etching to form the lower electrodes 14 in such a manner as to correspond to the TFTs 12, respectively. Note that the lower electrodes 14 penetrating the interlayer insulation film 13 are electrically connected to the TFTs 12 in the respective contact holes 15. At the same time, the base electrode 21 is formed with the same material as the lower electrodes 14. Thereafter, the lower electrodes 14 and the base electrode 21 are burned for one hour at 220° C.

Next, as illustrated in (b) of FIG. 7, a 150 nm-thick $SiO_2$ film is formed at the ends of the lower electrodes 14 and the base electrode 21 by sputtering, and exposed and developed by photoresist, and then patterned by etching to form the edge covers 16. Note that, the edge covers 16 are formed in such a manner as to partially expose the lower electrodes 14 and the base electrode 21.

Next, as illustrated in (c) of FIG. 7, a resist film 31 is applied on the entire substrate by spin coating, and exposed and developed by photolithography, and then patterned in such a manner as to partially expose the base electrode 21.

Next, as illustrated on (d) of FIG. 7, a copper film 32 is formed on the entire substrate by electroless plating in which the substrate is immersed in a solution into which copper sulfate or copper cyanide has been poured, as is the case of electroplating.

Thereafter, the substrate is subjected to ultrasonic cleaning and then the resist film 31 is removed by a lift off method (a method for removing a metal film on a resist film by a developing process), and the copper film serving as the dividing wall 17 is left only on the lower electrode 21.

Next, as illustrated in FIG. (f) of 7, the hole transport layers 18 and the light-emitting layers 19 are formed on the edge covers 16 in the respective spaces defined by the dividing wall 17. Further, the upper electrode 20 is formed on the entire insulation substrate 11 so as to cover the light-emitting layers 19 and the dividing wall 17. Note that, since the hole transport layers 18, the light-emitting layers 19, and the upper electrode 20 are formed by known processes, explanations for the processes are omitted.

Next, an UV cure resin or a thermosetting resin is applied on the periphery the sealing substrate 23, and the sealing substrate 23 made of a glass substrate and the like is attached to the insulation substrate 11 in the inert gas atmosphere to seal the organic EL elements 10. Consequently, the hollow parts 22 are formed between the organic EL elements 10 and the sealing substrate 23. Note that the sealing substrate 23 is attached with desiccant in advance, and this makes it possible to more efficiently reduce degradation of the organic EL elements 10 due to moisture.

In accordance with the foregoing processes, the organic EL device 2 is manufactured.

The present invention is not limited to the description of the embodiments above, but may be altered by a skilled person within the scope of the claims. An embodiment based on a proper combination of technical means disclosed in different embodiments is encompassed in the technical scope of the present invention.

The dividing wall of the organic EL device of the present invention is preferably formed with at least one of Cu, Ni, Zn, Cr, and Al.

The sealing substrate of the organic EL device of the present invention is preferably formed on the upper electrode.

According to the above configuration, it is possible to prevent the organic EL elements from being damaged by oxygen and water.

The dividing wall of the organic EL device of the present invention is preferably formed by electroplating.

According to the above configuration, since the dividing wall is highly adhesive to the base and difficult to come off in comparison with a conventional dividing wall made of an organic resin, it is possible to prevent the organic EL elements from being damaged by a coming off film.

Further, since it is easy to make the dividing wall thicker, it is possible to prevent the organic EL elements from being in contact with the sealing substrate. In addition, since elastic modulus is smaller than that of a dividing wall made of an organic resin, the organic EL elements are difficult to be deformed.

Further, electroplating is a multipurpose technique which has been carried out in many fields conventionally, and makes it possible to lower costs.

It is preferable that the organic EL device of the present invention further includes the base electrode made of the same material as the lower electrodes, and the dividing wall is formed on the base electrode.

According to the above configuration, since the dividing wall is formed only on the base electrode, it is possible to control the line width of the dividing wall freely. Therefore, a pixel open area ratio is not lowered and this makes it possible to realize high definition.

Further, since the base electrode is made at the same time as the lower electrodes of the organic EL device, formation of the base electrode does not require an additional step.

INDUSTRIAL APPLICABILITY

The present invention is applicable to an organic EL device. Particularly, since the present invention enables easy formation of a dividing wall of a thick film, the present invention is most suitable for a flexible organic EL device in which collision easily occurs by flexure or pressure.

REFERENCE SIGNS LIST 1, 2 Organic EL device
10 Organic EL element
10a, 10b, 10c Organic EL element
11 Insulation substrate
12 TFT
13 Interlayer insulation film
14 Lower electrode
15 Contact hole
16 Edge cover
17 Dividing wall
18 Hole transport layer
19 Light-emitting layer
19a, 19b, 19c Light-emitting layer
20 Upper electrode
21 Base electrode
22 Hollow part
23 Sealing substrate
25 Stationary tank
26 Hook jig
30 Pixel
31 Resist film
32 Copper film
G Gate wiring
S Source wiring

The invention claimed is:
1. An organic EL device having a plurality of luminescence regions, comprising:
    a substrate;
    a plurality of lower electrodes on the substrate, the plurality of lower electrodes corresponding to the luminescence regions, respectively;
    a dividing wall formed so as to surround the luminescence regions;
    light-emitting layers formed on the plurality of lower electrodes in the luminescence regions, respectively;
    a first upper electrode formed on the dividing wall;

a second upper electrode formed on the light-emitting layers; and edge covers provided on the lower electrodes so as to partially expose the lower electrodes, the dividing wall being conductive and connected to the first and second upper electrodes electrically, the dividing wall being provided between adjacent ones of the edge covers which adjacent ones are provided in adjacent ones of the luminescence regions, respectively.

2. The organic EL device as set forth in claim 1, wherein: the dividing wall includes at least one of Cu, Ni, Zn, Cr, and Al.

3. The organic EL device as set forth in claim 1, wherein: a sealing substrate is formed on the first upper electrode.

4. The organic EL device as set forth in claim 3, wherein: the dividing wall is a spacer supporting the substrate and the sealing substrate.

5. The organic EL device as set forth in claim 1, wherein: the dividing wall is formed by electroplating.

6. The organic EL device as set forth in claim 5, further comprising:

a base electrode made of a same material as the lower electrodes, the dividing wall being formed on the base electrode, the base electrode being connected to the dividing wall electrically.

7. An electronic device, comprising the organic EL device as set forth in claim 1.

8. The organic EL device as set forth in claim 1, wherein: the second upper electrode is connected to the side surface of the dividing wall electrically.

9. A process for production of an organic EL device having a plurality of luminescence regions, comprising the steps of:

forming a plurality of lower electrodes on a substrate so that the plurality of lower electrodes correspond to the luminescence regions, respectively, and at a same time, forming, between adjacent ones of the plurality of lower electrodes, a base electrode made of a same material as the plurality of lower electrodes;

forming edge covers on the lower electrodes so as to partially expose the lower electrodes;

forming a dividing wall between adjacent ones of the edge covers which adjacent ones are provided in adjacent ones of the luminescence regions, respectively on the base electrode by electroplating in such a manner as to surround the luminescence regions;

forming light-emitting layers on the lower electrodes in the luminescence regions, respectively; and forming an upper electrode on the dividing wall and the light-emitting layers so that the upper electrode is electrically connected to the dividing wall.

* * * * *